United States Patent
Chen et al.

(10) Patent No.: US 9,397,081 B2
(45) Date of Patent: Jul. 19, 2016

(54) FABRICATION METHOD OF SEMICONDUCTOR PACKAGE HAVING EMBEDDED SEMICONDUCTOR ELEMENTS

(71) Applicant: Siliconware Precision Industries Co., Ltd., Taichung (TW)

(72) Inventors: Yan-Heng Chen, Taichung (TW); Chun-Tang Lin, Taichung (TW); Yan-Yi Liao, Taichung (TW); Hung-Wen Liu, Taichung (TW); Chieh-Yuan Chi, Taichung (TW); Hsi-Chang Hsu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 14/873,445

(22) Filed: Oct. 2, 2015

(65) Prior Publication Data

US 2016/0141281 A1    May 19, 2016

Related U.S. Application Data

(62) Division of application No. 14/013,420, filed on Aug. 29, 2013, now Pat. No. 9,177,859.

(30) Foreign Application Priority Data

May 10, 2013    (TW) ............................ 102116654 A

(51) Int. Cl.
*H01L 23/31* (2006.01)
*H01L 23/13* (2006.01)
*H01L 23/538* (2006.01)
*H01L 25/065* (2006.01)
*H01L 25/00* (2006.01)
*H01L 21/768* (2006.01)

(52) U.S. Cl.
CPC .............. *H01L 25/50* (2013.01); *H01L 21/768* (2013.01); *H01L 25/0657* (2013.01); *H01L 2225/06548* (2013.01)

(58) Field of Classification Search
CPC ..... H01L 23/12; H01L 23/13; H01L 23/3114; H01L 23/5389; H01L 25/0657
See application file for complete search history.

(56) References Cited

U.S. PATENT DOCUMENTS

| | | |
|---|---|---|
| 5,049,978 A | 9/1991 | Bates et al. |
| 5,285,107 A | 2/1994 | Kazami et al. |
| 6,242,932 B1 | 6/2001 | Hembree |

(Continued)

*Primary Examiner* — Thanh V Pham
(74) *Attorney, Agent, or Firm* — Mintz Levin Cohn Ferris Glovsky and Popeo, P.C.; Peter F. Corless; Steven M. Jensen

(57) ABSTRACT

A semiconductor package is disclosed, which includes: a carrier having at least an opening; a plurality of conductive traces formed on the carrier and in the opening; a first semiconductor element disposed in the opening and electrically connected to the conductive traces; a second semiconductor element disposed on the first semiconductor element in the opening; and a redistribution layer structure formed on the carrier and the second semiconductor element for electrically connecting the conductive traces and the second semiconductor element. Since the semiconductor elements are embedded and therefore positioned in the opening of the carrier, the present invention eliminates the need to perform a molding process before forming the redistribution layer structure and prevents the semiconductor elements from displacement.

12 Claims, 7 Drawing Sheets

(56) References Cited

U.S. PATENT DOCUMENTS

| | | |
|---|---|---|
| 6,365,960 B1 | 4/2002 | Pollock et al. |
| 6,492,216 B1 | 12/2002 | Yeo et al. |
| 6,603,193 B2 | 8/2003 | Crane, Jr. et al. |
| 6,670,557 B2 | 12/2003 | Gehrke et al. |
| 6,916,668 B2 | 7/2005 | Spielberger et al. |
| 7,651,889 B2 | 1/2010 | Tang et al. |
| 8,278,746 B2 | 10/2012 | Ding et al. |
| 8,432,022 B1 | 4/2013 | Huemoeller et al. |
| 2009/0127686 A1 | 5/2009 | Yang et al. |
| 2012/0182066 A1 | 7/2012 | Merkle et al. |

FABRICATION METHOD OF SEMICONDUCTOR PACKAGE HAVING EMBEDDED SEMICONDUCTOR ELEMENTS

CROSS-REFERENCE TO RELATED APPLICATIONS

This application is a divisional of copending application U.S. Ser. No. 14/013,420, filed on Aug. 29, 2013, which claims under 35 U.S.C. §119(a) the benefit of Taiwanese Application No. 102116654, filed May 10, 2013, the entire contents of which are incorporated herein by reference.

BACKGROUND OF THE INVENTION

1. Field of the Invention

The present invention relates to semiconductor packages, and more particularly, to a semiconductor package having embedded semiconductor elements and a fabrication method of the semiconductor package that can prevent displacement of the semiconductor elements during a die attachment process.

2. Description of Related Art

Along with the rapid development of electronic industries, electronic products are developed towards multi-function and high electrical performance. Accordingly, wafer level packaging (WLP) technologies have been developed to meet the miniaturization requirement of semiconductor packages.

FIGS. 1A to 1D are schematic cross-sectional views illustrating a fabrication method of a wafer level semiconductor package 1 according to the prior art.

Referring to FIG. 1A, a thermal release tape 11 is formed on a carrier 10.

A plurality of semiconductor elements 12 are disposed on the thermal release tape 11. Each of the semiconductor elements 12 has an active surface 12a with a plurality of electrode pads 120 and an inactive surface 12b opposite to the active surface 12a. The semiconductor elements 12 are attached to the thermal release tape 11 via the active surfaces 12a thereof.

Referring to FIG. 1B, an encapsulant 13 is formed on the thermal release tape 11 by molding so as to encapsulate the semiconductor elements 12.

Referring to FIG. 1C, a curing process is performed to cure the encapsulant 13. During the process, the thermal release tape 100 is heated and loses its adhesive property. As such, the thermal release tape 11 and the carrier 10 can be removed to expose the active surfaces 12a of the semiconductor elements 12.

Referring to FIG. 1D, a RDL (Redistribution Layer) process is performed to form a RDL structure 14 on the encapsulant 13 and the active surfaces 12a of the semiconductor elements 12. The RDL structure 14 is electrically connected to the electrode pads 120 of the semiconductor elements 12.

Then, an insulating layer 15 is formed on the RDL structure 14, and portions of the RDL structure 14 are exposed from the insulating layer 15 so as for conductive elements 16 such as solder balls to be mounted thereon.

However, the thermal release tape 11 is flexible and easily expands when being heated. Therefore, a positional deviation easily occurs to the semiconductor elements 12 due to expansion of the thermal release tape when being heated along with impact of the mold flow during the molding process. That is, the semiconductor elements 12 deviate from die areas B on the thermal release tape 11, as shown in FIG. 1D'. Further, after the carrier 10 is removed, warpage easily occurs to the encapsulant 13. Therefore, it becomes difficult for the RDL structure 14 to be aligned with the electrode pads 120 of the semiconductor elements 12. The larger the size of the carrier 10, the bigger the position error between the semiconductor elements 12 is, thereby adversely affecting the electrical connection between the RDL structure 14 and the electrode pads 120. As such, the product reliability and yield are reduced.

Further, the use of the thermal release tape 11 incurs a high fabrication cost.

Therefore, there is a need to provide a semiconductor package and a fabrication method thereof so as to overcome the above-described disadvantages.

SUMMARY OF THE INVENTION

In view of the above-described disadvantages, the present invention provides a semiconductor package, which comprises: a carrier having opposite first and second surfaces, with at least an opening having a bottom portion; a plurality of conductive traces formed on the bottom portion, side walls of the opening and the first surface of the carrier; a first semiconductor element disposed in the opening, wherein the first semiconductor element has a first active surface with a plurality of first electrode pads and the first active surface, opposite to a first inactive surface, faces the bottom portion of the opening so as for the first electrode pads to be electrically connected to the conductive traces; a second semiconductor element disposed on the first semiconductor element, wherein the second semiconductor element has a second active surface with a plurality of second electrode pads exposed from the opening, and a second inactive surface, opposite to the second active surface, attached to the first inactive surface of the first semiconductor element; and a redistribution layer formed on the first surface of the carrier and the second active surface of the second semiconductor element for being electrically connected to the conductive traces and the second electrode pads on the second active surface of the second semiconductor element.

The present invention further provides a fabrication method of a semiconductor package, which comprises the steps of: providing a carrier having opposite first and second surfaces; forming at least an opening on the first surface of the carrier, wherein the opening has a bottom portion; forming a plurality of conductive traces on the first surface of the carrier, the bottom portion and side walls of the opening; disposing a first semiconductor element in the opening, wherein the first semiconductor element has a first active surface with a plurality of first electrode pads and a first inactive surface opposite to the first active surface, and the first active surface faces the bottom portion of the opening so as for the first electrode pads to be electrically connected to the conductive traces; disposing a second semiconductor element on the first semiconductor element, wherein the second semiconductor element has a second active surface with a plurality of second electrode pads, exposed from the opening, and a second inactive surface, opposite to the second active surface, attached to the first inactive surface of the first semiconductor element; and forming a redistribution layer on the first surface of the carrier and the second active surface of the second semiconductor element for being electrically connected to the conductive traces and the second electrode pads on the second active surface of the second semiconductor element.

In the above-described package and method, the carrier can be a semiconductor substrate or a glass substrate.

In the above-described package and method, the opening can have a first receiving space in communication with a second receiving space. The first receiving space is formed by the bottom portion and side walls of the opening adjacent to the bottom portion so as for the first semiconductor element to be disposed therein. The volume of the first receiving space can be smaller than or equal to that of the second receiving space.

In the above-described package and method, the side walls of the opening can be step shaped.

In the above-described package and method, the width of the first semiconductor element can be smaller than or equal to that of the second semiconductor element.

In the above-described package and method, the carrier can further have a plurality of conductive vias formed on the second surface of the carrier, and the conductive vias extend to the bottom portion of the opening so as to be electrically connected to the first semiconductor element. Forming the conductive vias is performed by forming a plurality of via holes on the bottom portion of the opening; and forming conductive parts in the via holes during formation of the conductive traces.

The first semiconductor element can be electrically connected to the conductive vias through a plurality of conductive elements. The method can further comprise thinning the second surface of the carrier so as to expose the conductive parts from the second surface of the carrier. Alternatively, the via holes can be in communication with the second surface of the carrier and the bottom portion of the opening such that the conductive parts formed in the via holes are exposed from the second surface of the carrier Further, an electronic element can be attached to the second surface of the carrier and electrically connected to the conductive vias.

According to the present invention, the first and second semiconductor elements are embedded and therefore positioned in the opening of the carrier. Compared with the prior art, the present invention has no need to utilize the conventional thermal release tape and the molding process and hence prevents the first and second semiconductor elements from displacement. As such, during mass production, the position error between the second semiconductor elements does not increase with the size of the carrier. Consequently, the RDL structure can be effectively aligned with the second semiconductor elements, thereby improving the product reliability and yield.

Further, since the carrier is made of a hard material, the present invention dispenses with a heating process for curing the carrier and accordingly prevents warpage of the carrier.

Furthermore, the carrier made of a semiconductor or glass substrate is easy to fabricate and hence the fabrication cost is greatly reduced.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "upper", "on", "first", "second" etc. are merely for illustrative purposes and should not be construed to limit the scope of the present invention.

FIGS. 2A to 2F are schematic cross-sectional views illustrating a fabrication method of a semiconductor package according to a first embodiment of the present invention. The method can be based on a panel level or wafer level packaging process.

Figure 1A:
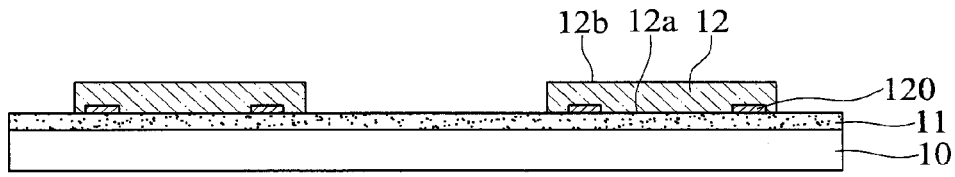
FIGS. 1A to 1D are schematic cross-sectional views illustrating a fabrication method of a semiconductor package according to the prior art, wherein FIG. 1D' is an upper view of FIG. 1C.
Figure 1B:
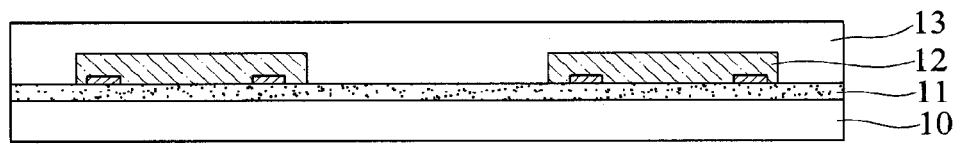
Figure 1C:
Figure 1D:
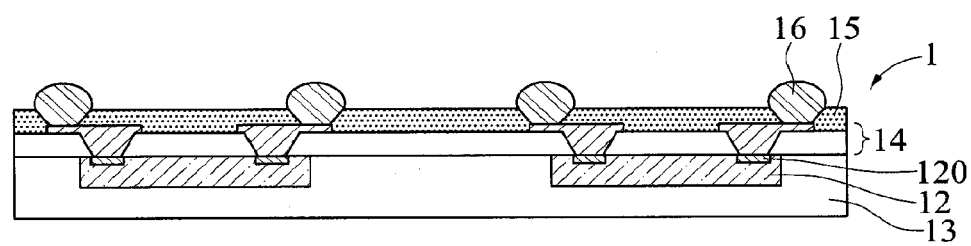
Figure 1D:
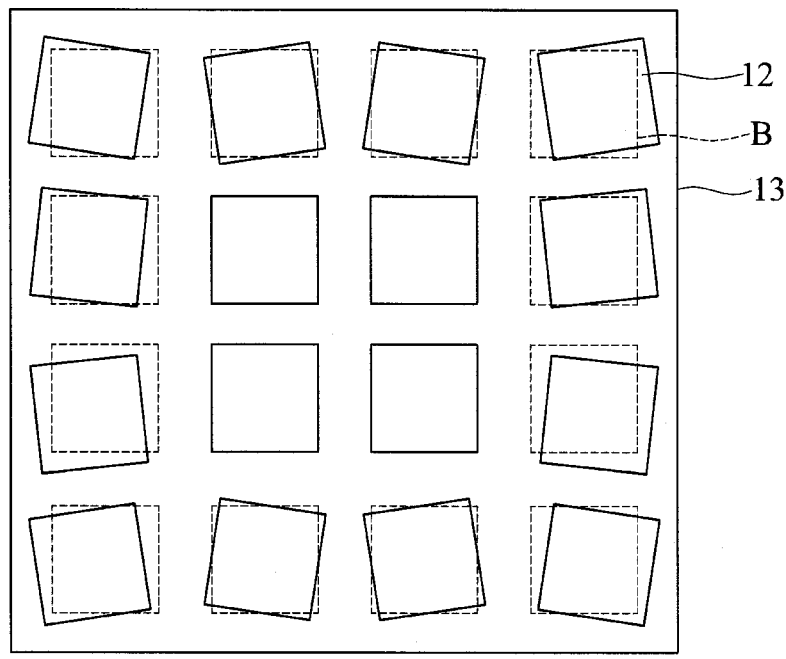
Figure 2A:
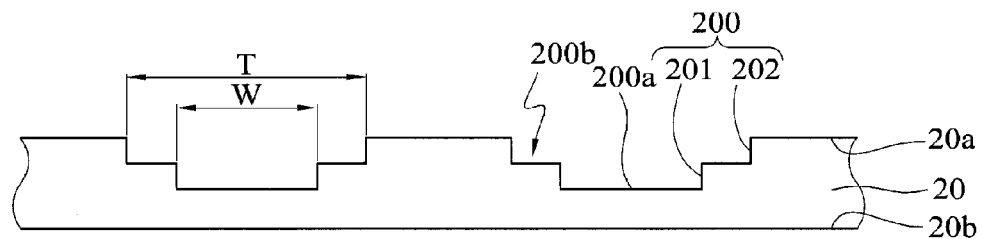
FIGS. 2A to 2F are schematic cross-sectional views illustrating a fabrication method of a semiconductor package according to a first embodiment of the present invention.

Referring to FIG. 2A, a carrier 20 having opposite first and second surfaces 20a, 20b is provided. A plurality of openings 200 are formed on the first surface 20a of the carrier 20, and each has a bottom portion 200a.

In the present embodiment, the carrier 20 can be a semiconductor substrate such as a wafer or a silicon, or a glass substrate. The wafer can be made of SiC, amorphous Si, GaAs or $Al_2O_3$.

Each of the openings 200 has a first receiving space 201 in communication with a second receiving space 202. The first receiving space 201 is formed by the bottom portion 200a and side walls 200b adjacent to the bottom portion 200a.

The side walls 200b of the opening 200 are step shaped. Referring to FIG. 2A, the side walls 200b of the opening 200 have a vertical step shape. Alternatively, the side walls 200b of the opening 200 can have a non-vertical step shape (not shown). The volume (or width W) of the first receiving space 201 is smaller than the volume (or width T) of the second receiving space 202. The step-shaped openings 200 can be formed by photolithography and etching (dry etching or wet etching).

In another embodiment, the volume (or width W) of the first receiving space 201 can be equal to the volume (or width T) of the second receiving space 202 such that the side walls 200b of the openings 200 have a vertical planar shape.

Figure 2B:
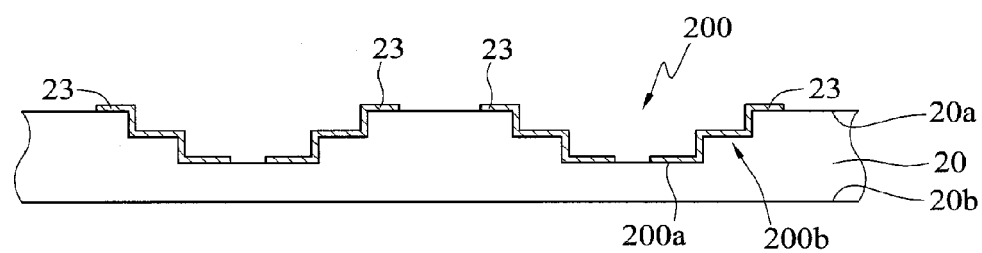

Referring to FIG. 2B, a plurality of conductive traces 23 are formed on the bottom portions 200a, the side walls 200b of the openings 200 and the first surface 20a of the carrier 20. In particular, the conductive traces 23 extend from the bottom portions 200a of the openings 200 through the side walls 200b of the openings 200 to the first surface 20a of the carrier 20.

In the present embodiment, the conductive traces 23 are formed by photolithography.

Figure 2C:
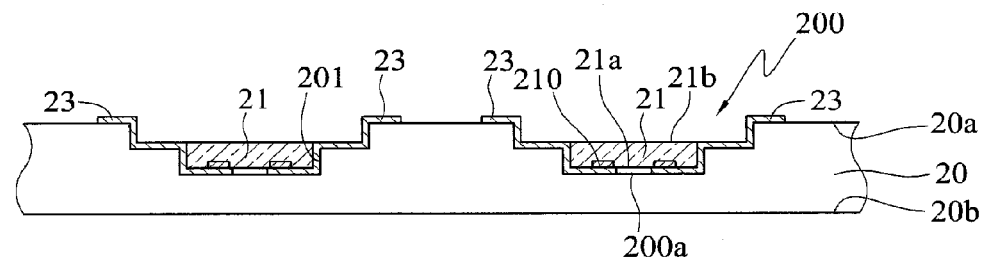

Referring to FIG. 2C, a plurality of first semiconductor elements 21 are disposed in the openings 200 so as to be disposed in the first receiving spaces 201.

In the present embodiment, each of the first semiconductor elements 21 has a first active surface 21a with a plurality of first electrode pads 210 and a first inactive surface 21b opposite to the first active surface 21a. The first active surface 21a faces the bottom portion 200a of the corresponding opening 200 so as for the first electrode pads 210 to be in contact and electrically connected to the conductive traces 23 on the bottom portion 200a.

Figure 2D:
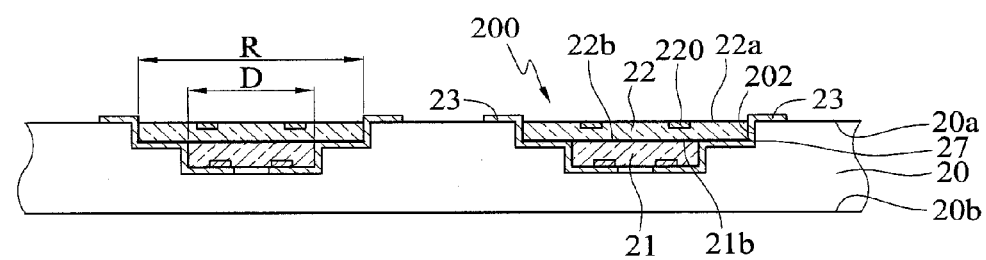

Referring to FIG. 2D, a plurality of second semiconductor elements 22 are stacked on the first semiconductor elements 21 via an adhesive layer 27. Each of the second semiconductor elements 22 has a second active surface 22a with a plurality of second electrode pads 220 and a second inactive surface 22b opposite to the second active surface 22a. The second inactive surface 22b of the second semiconductor element 22 is attached to the first inactive surface 21b of the corresponding first semiconductor element 21, and the second active surface 22a with the electrode pads 220 is exposed from the corresponding opening 200.

In the present embodiment, the second semiconductor element 22 is disposed in the second receiving space 202.

The planar size (the size in a horizontal direction such as width D) of the first semiconductor element 21 is smaller than or equal to the planar size (width R) of the second semiconductor element 22.

In anther embodiment, the planar size of the first semiconductor element 21 can be equal to the planar size of the second semiconductor element 22.

Further, the number of the second semiconductor elements 22 can be varied according to the practical requirement.

Figure 2E:
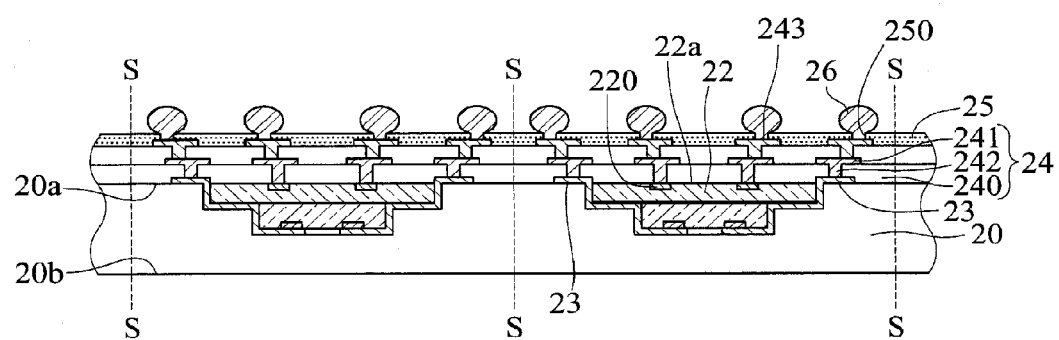

Referring to FIG. 2E, a RDL process is performed to form a RDL structure 24 on the first surface 20a of the carrier 20 and the second active surfaces 22a of the second semiconductor elements 22 so as to electrically connect the conductive traces 23 to the second electrode pads 220 of the second semiconductor elements 22.

In the present embodiment, the RDL structure 24 has a plurality of dielectric layers 240, a plurality of circuit layers 241 formed on the dielectric layers 240 and a plurality of conductive vias 242 formed in the dielectric layers 240 for electrically connecting the circuit layers 241 to the conductive traces 23 on the first surface 20a of the carrier 20 and the second electrode pads 220 of the second semiconductor elements 22.

The outermost circuit layer 241 has a plurality of conductive pads 243. Further, an insulating layer 25 is formed on the RDL structure 24 and has a plurality of openings 250 for exposing the conductive pads 243. A plurality of conductive elements 26 such as solder balls are formed on the conductive pads 243 in the openings 250 for electrically connecting the conductive pads 243 and an external element (not shown).

The second semiconductor elements 22 are electrically connected to the conductive traces 23 through the circuit layers 241 and the conductive vias 242.

Figure 2F:
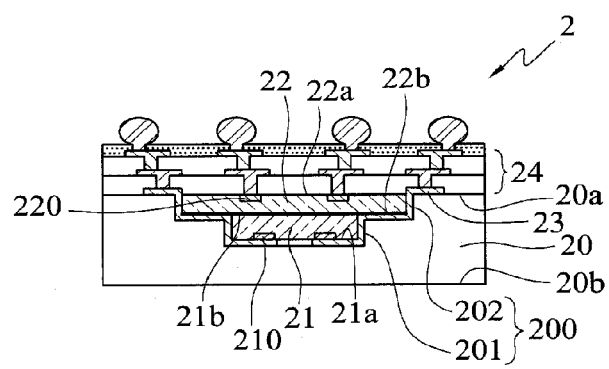

Referring to FIG. 2F, a singulation process is performed along cutting paths S of FIG. 2E so as to obtain a plurality of semiconductor packages 2.

According to the present invention, the first and second semiconductor elements 21, 22 are embedded and therefore positioned in the openings 200 of the carrier 20. As such, the present invention doesn't utilize the conventional thermal release tape and the molding process. Consequently, the present invention prevents the first and second semiconductor elements 21, 22 from being adversely affected by thermal expansion of the thermal release tape and impact of the mold flow as in the prior art, thereby preventing the first and second semiconductor elements 21, 22 from displacement. Further, the position error between the second semiconductor elements 22 does not increase with the size of the carrier 20. Therefore, the position of the second semiconductor elements 22 can be precisely controlled. As such, the conductive vias 242 can be effectively aligned with the second semiconductor elements 22, thereby improving the product reliability and yield.

Further, since the carrier 20 is made of a hard material, the present invention dispenses with a heating process for curing the carrier 20 and accordingly prevents warpage of the carrier 20.

Furthermore, the carrier 20 made of a semiconductor substrate or a glass substrate is easy to fabricate and hence the fabrication cost is greatly reduced.

FIGS. 3A to 3F are schematic cross-sectional views illustrating a fabrication method of a semiconductor package 3 according to a second embodiment of the present invention.

The present embodiment is similar to the first embodiment. The present embodiment differs from the first embodiment in that a plurality of conductive vias 30 are formed on the bottom portions 200a of the openings 200.

Figure 3A:
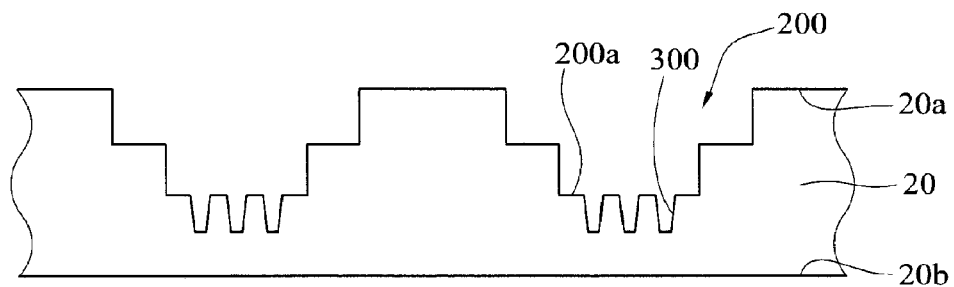
FIGS. 3A to 3F are schematic cross-sectional views illustrating a fabrication method of a semiconductor package according to a second embodiment of the present invention, wherein FIGS. 3A' and 3B' show different embodiments of FIGS. 3A and 3B, respectively.
Figure 3A:
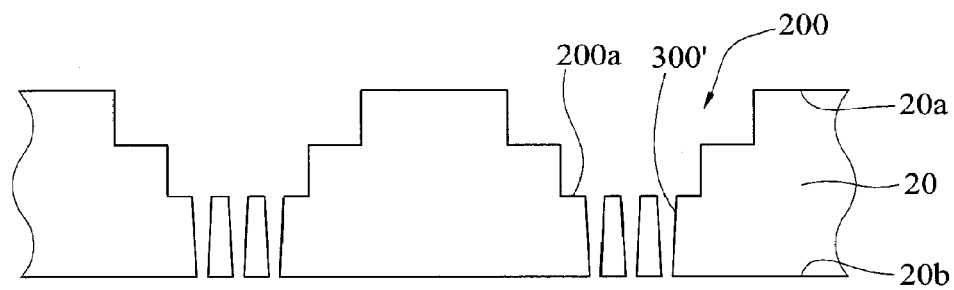

Referring to FIG. 3A, after the openings 200 are formed, a plurality of via holes 300 are formed on the bottom portions 200a of the openings 200 by laser drilling.

In the present embodiment, the via holes 300 do not extend to the second surface 20b of the carrier 20. In another embodiment, referring to FIG. 3A', the via holes 300 are in communication with the second surface 20b of the carrier 20 and the bottom portions 200a of the openings 200.

Figure 3B:
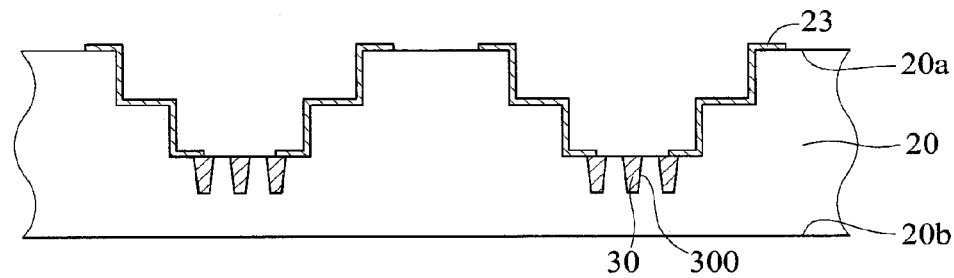
Figure 3B:
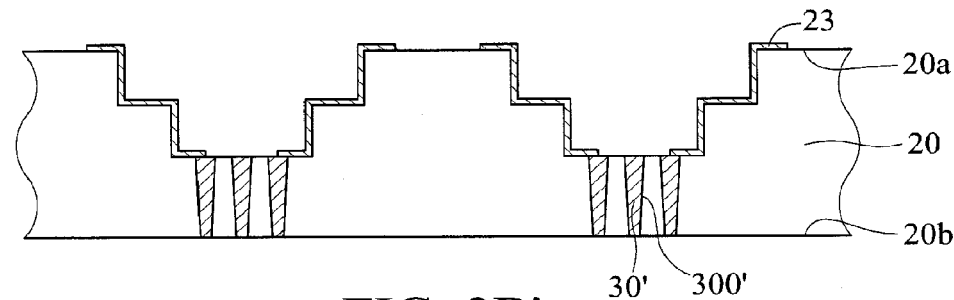

Referring to FIG. 3B, continued from FIG. 3A, during formation of a plurality of conductive traces 23, a plurality of conductive vias 30 made of such as copper are formed in the via holes 300.

In the present embodiment, if the via holes 300 are not deep, only one patterning and process is performed to form the conductive traces 22 and the conductive vias 30. That is, the conductive traces 22 and the conductive vias 30 are formed by patterning and electroplating at the same time.

Further, various electroplating techniques such as a seed layer and photoresist can be used.

Referring to FIGS. 3A' and 3B', if the via holes 300' are deep, two patterning processes can be performed. That is, a plurality conductive vias 30 are formed through a first patterning process and then the conductive traces 23 are formed through a second patterning process.

Further, various patterning techniques such as deposition and etching can be used.

Figure 3C:
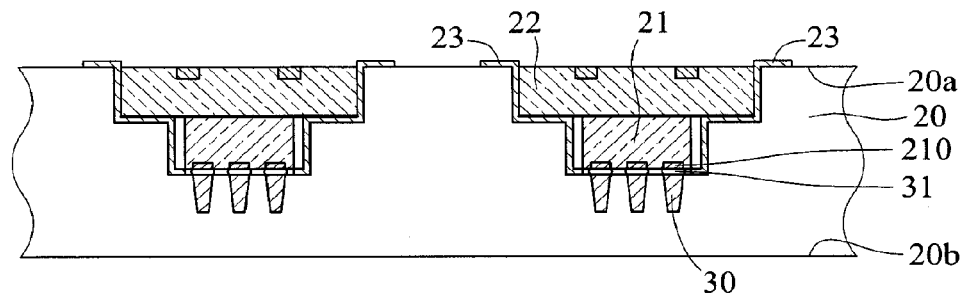

Referring to FIG. 3C, a plurality of first semiconductor elements 21 and a plurality of second semiconductor elements 22 are disposed in the openings 200 and the conductive vias 30 are electrically connected to the first electrode pads 210 of the first semiconductor elements 21.

In the present embodiment, portions of the first electrode pads 210 of the first semiconductor elements 21 are electrically connected to the conductive vias 30 through a plurality of conductive elements 31 such as metal bumps, and portions of the first electrode pads 210 of the first semiconductor elements 21 are electrically connected to the conductive traces 23.

Figure 3D:
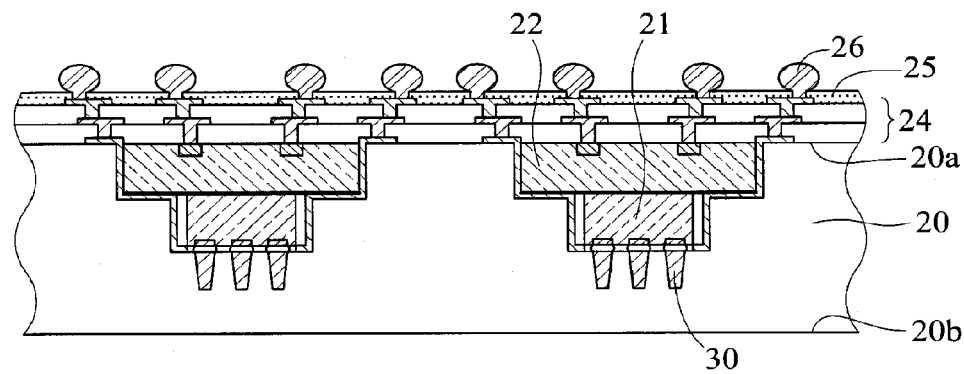

Referring to FIG. 3D, similar to the first embodiment, a RDL structure 24, an insulating layer 25 and a plurality of conductive elements 26 are formed.

Figure 3E:
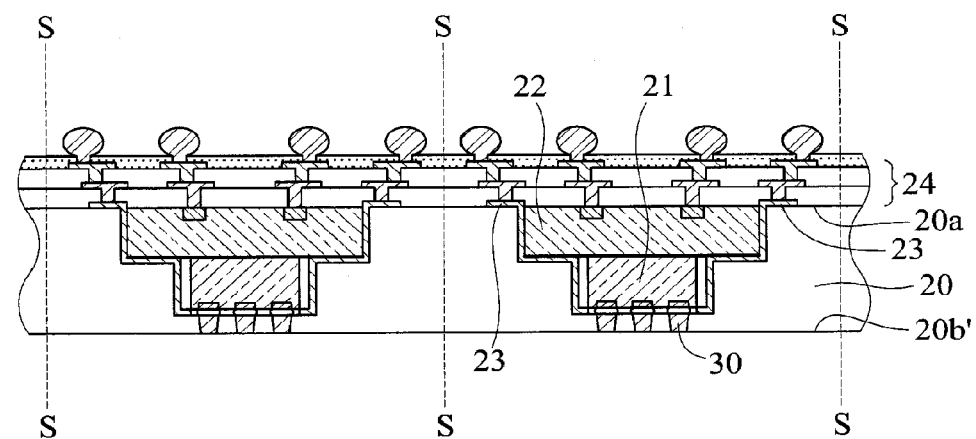

Referring to FIG. 3E, the second surface 20b of the carrier 20 is thinned to form a surface 20b' that exposes the conductive vias 30.

If the process is continued from FIG. 3A', since the via holes 300' communicate with the second surface 20b of the carrier 20, the conductive vias 30 formed in the via holes 300' are directly exposed from the second surface 20b of the carrier 20 and therefore the thinning process can be omitted.

Figure 3F:
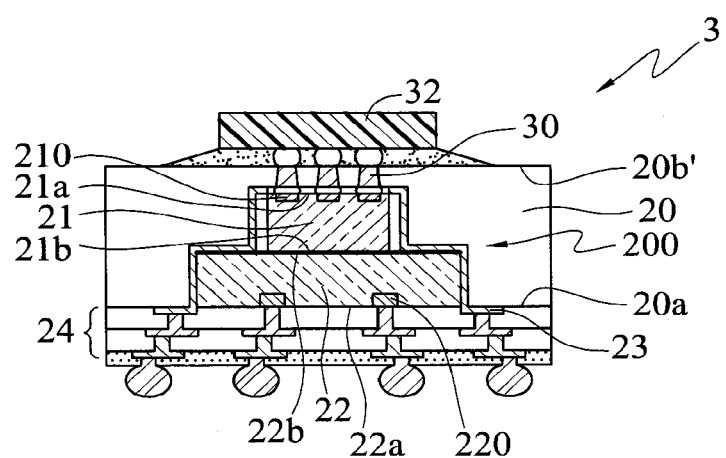

Referring to FIG. 3F, a plurality of electronic elements 32 are disposed on the second surface 20b' of the carrier 20 and electrically connected to the conductive vias 30. Then, a singulation process is performed along cutting paths S of FIG. 3E so as to obtain a plurality of semiconductor packages 3.

In the present embodiment, the electronic elements 32 can be packages, chips or passive electronic elements.

The electronic elements 32 can be attached to the second surface 20b' of the carrier 20 through an underfill or through a molding process.

Further, the formation of the conductive vias 30 is not limited to the above-described steps. For example, after the process of FIG. 2E, a plurality of via holes 300 can be formed so as for conductive vias 30 to be formed therein.

The present invention further provides a semiconductor package 2, 3, which has: a carrier 20 having a first surface 20a and a second surface 20b, 20b' opposite to the first surface 20a and at least an opening 200 formed on the first surface 20a and having a bottom portion 200a; a plurality of conductive traces 23 formed on the bottom portion 200a, side walls 200b of the opening 200 and the first surface 20a of the carrier 20; a first semiconductor element 21 disposed in the opening 200, wherein the first semiconductor element 21 has a first active surface 21a with a plurality of first electrode pads 210 and a first inactive surface 21b opposite to the first active surface 21a, and the first active surface 21a faces the bottom portion 200a of the opening 200 so as for the first electrode pads 210 to be electrically connected to the conductive traces 23; a second semiconductor element 22 disposed on the first semiconductor element 21, wherein the second semiconductor element 22 has a second active surface 22a with a plurality of second electrode pads 220 and a second inactive surface 22b opposite to the second active surface 22a, the second inactive surface 22b of the second semiconductor element 22 is attached to the first inactive surface 21b of the first semiconductor element 21, and the second active surface 22a with the second electrode pads 220 is exposed from the opening 200; and a RDL structure 24 formed on the first surface 20a of the carrier 20 and the second active surface 22a of the second semiconductor element 22 for electrically being connected to the conductive traces 23 and the second electrode pads 220 on the second active surface 22a of the second semiconductor element 22.

In an embodiment, the opening 200 has a first receiving space 201 in communication with a second receiving space 202. The first receiving space 201 is formed by the bottom portion 200a and the side walls 200b of the opening 200 adjacent to the bottom portion 200a so as for the first semiconductor element 21 to be disposed therein. The volume of the first receiving space 201 can be smaller than or equal to that of the second receiving space 202.

In an embodiment, the side walls 200b of the opening 200 are step shaped.

In an embodiment, the width D of the first semiconductor element 21 is smaller than or equal to the width R of the second semiconductor element 22.

In an embodiment, the carrier 20 can further have a plurality of conductive vias 30, formed on the second surface 20b' of the carrier 20, extending to the bottom portion 200a of the opening 200. The conductive vias 30 can be electrically connected to the first electrode pads 210 of the first semiconductor element 21 through a plurality of conductive elements 31.

The semiconductor package 3 can further have an electronic element 32 attached to the second surface 20b of the carrier 20 and electrically connected to the conductive vias 30.

Since the first and second semiconductor elements are embedded and therefore positioned in the opening of the carrier, the present invention prevents the first and second semiconductor elements from displacement. As such, the position error between the second semiconductor elements does not increase with the size of the carrier. Therefore, the position of the second semiconductor elements 22 can be precisely controlled so as to facilitate an effective electrical connection between the RDL structure and the second semiconductor elements, thereby improving the product reliability and yield.

Further, since the carrier is made of a hard material, the present invention doesn't utilize a heating process for curing the carrier and accordingly prevents warpage of the carrier.

Furthermore, the carrier made of a semiconductor or glass substrate is easy to fabricate and hence the fabrication cost is greatly reduced.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor package, comprising the steps of:
   providing a carrier having opposite first and second surfaces;
   forming at least an opening on the first surface of the carrier, wherein the opening has a bottom portion;
   forming a plurality of conductive traces on the first surface of the carrier, and the bottom portion and side walls of the opening;
   disposing a first semiconductor element in the opening, wherein the first semiconductor element has a first active surface with a plurality of first electrode pads and a first inactive surface opposite to the first active surface, and the first active surface faces the bottom portion of the opening so as for the first electrode pads to be electrically connected to the conductive traces;
   disposing a second semiconductor element on the first semiconductor element, wherein the second semiconductor element has a second active surface with a plurality of second electrode pads which are exposed from the opening, and a second inactive surface, opposite to the second active surface, attached to the first inactive surface of the first semiconductor element; and
   forming a redistribution layer structure on the first surface of the carrier and the second active surface of the second semiconductor element for being electrically connected to the conductive traces and the second electrode pads on the second active surface of the second semiconductor element.

2. The method of claim 1, wherein the carrier is a semiconductor substrate or a glass substrate.

3. The method of claim 1, wherein the opening has a first receiving space in communication with a second receiving space, and the first receiving space is formed by the bottom portion and side walls adjacent to the bottom portion so as for the first semiconductor element to be disposed therein.

4. The method of claim 3, wherein the volume of the first receiving space is smaller than or equal to that of the second receiving space.

5. The method of claim 1, wherein the side walls of the opening are step shaped.

6. The method of claim 1, wherein the width of the first semiconductor element is smaller than or equal to that of the second semiconductor element.

7. The method of claim 1, wherein the carrier further has a plurality of conductive vias, formed on the second surface of the carrier, and the conductive vias extend to the bottom portion of the opening so as to be electrically connected to the first semiconductor element.

8. The method of claim 7, wherein forming the conductive vias comprises:
   forming a plurality of via holes on the bottom portion of the opening; and
   forming conductive parts in the via holes during formation of the conductive traces.

9. The method of claim 8, further comprising thinning the second surface of the carrier so as to expose the conductive parts from the second surface of the carrier.

10. The method of claim 8, wherein the via holes are in communication with the second surface of the carrier and the bottom portion of the opening such that the conductive parts formed in the via holes are exposed from the second surface of the carrier.

11. The method of claim 7, wherein the first semiconductor element is electrically connected to the conductive vias through a plurality of conductive elements.

12. The method of claim 7, further comprising attaching an electronic element to the second surface of the carrier and electrically connecting the electronic element to the conductive vias.

* * * * *